United States Patent [19]

Kishita et al.

[11] Patent Number: 4,650,543
[45] Date of Patent: Mar. 17, 1987

[54] METHOD OF FORMING ELECTRODE PATTERN OF SEMICONDUCTOR DEVICE

[75] Inventors: Yoshihiro Kishita, Kawasaki; Motoki Furukawa, Yokohama; Tatsuro Mitani, Tokyo, all of Japan

[73] Assignee: Kabushiki Kaisha Toshiba, Japan

[21] Appl. No.: 706,617

[22] Filed: Feb. 28, 1985

[30] Foreign Application Priority Data

Mar. 2, 1984 [JP] Japan .................................. 59-38629

[51] Int. Cl.⁴ ............................. C23F 1/02; B44C 1/22; C03C 15/00; C03C 25/06
[52] U.S. Cl. ..................................... 156/643; 29/591; 156/646; 156/652; 156/656; 156/659.1; 204/192 EC; 204/192 E; 427/89
[58] Field of Search ............... 156/643, 646, 652, 656, 156/659.1, 662; 29/569 R, 591; 357/71; 427/89; 204/192 E, 192 EC

[56] References Cited

U.S. PATENT DOCUMENTS

| | | | |
|---|---|---|---|
| 3,994,758 | 11/1976 | Ogawa et al. | 156/3 |
| 4,272,348 | 1/1981 | Cox et al. | 156/656 X |
| 4,301,233 | 11/1981 | Calviello | 156/652 X |

FOREIGN PATENT DOCUMENTS 0057558 8/1982 European Pat. Off. .

OTHER PUBLICATIONS

S. Takahashi et al., "Submicrometer Gate Fabrication of GaAs MESFET by Plasma Etching", IEEE Transactions on Electron Devices, vol. ED-25, No. 10, pp. 1213-1218, Oct. 1978.
Patent Abstracts of Japan, vol. 6, No. 254, Dec. 14, 1982, p. (E-148) (1131); and JP-A-57-153475 (Nippon Denki), 22-10-1982.

*Primary Examiner*—William A. Powell
*Attorney, Agent, or Firm*—Finnegan, Henderson, Farabow, Garrett & Dunner

[57] ABSTRACT

A method of forming an electrode pattern on a surface of a semiconductor substrate which comprises the steps of forming a metal film which is vulnerable to a reactive ion etching on a surface of the semiconductor substrate, forming on the metal film another metal film which is vulnerable to an ion milling but is resistant to the reactive ion etching, forming a resist pattern on the another metal film, selectively etching the another metal film by the ion milling using the resist pattern as a mask, and selectively etching the metal film by the reactive ion etching using the another metal film as a mask. A semiconductor device having an electrode pattern as formed by the above method is also disclosed.

13 Claims, 3 Drawing Figures

METHOD OF FORMING ELECTRODE PATTERN OF SEMICONDUCTOR DEVICE

BACKGROUND OF THE INVENTION (a) Field of the Invention

The present invention relates to a method of forming an electrode pattern on a surface of a GaAs semiconductor substrate and a novel electrode pattern formed of a metal multilayer obtained thereby.

Note that in this specification, an electrode pattern includes an electrode wiring layer, a bonding pad and similar conductive layers.

(b) Description of the Prior Art

A GaAs FET electrode wiring layer or bonding pad having a three-layered structure of Au/Pt/Ti (elements described on the left hereinafter denote uppermost layers unless otherwise noted) or a two-layered structure of Al/Ti is conventionally known. The electrode wiring layer or the bonding pad is sometimes formed by a wet etching method but mainly by a lift-off method.

A method of forming a bonding pad by wet etching will be described hereinafter. In this case, an insulating film is formed on a GaAs semiconductor substrate by CVD, and thereafter a contact hole is selectively formed in the insulating film. A metal film for forming a bonding pad is deposited on the overall surface of the substrate, and a resist pattern is formed thereon. Finally, the metal film is etched by wet etching using the resist pattern as a mask so as to form a bonding pad of the metal film on the hole of the insulating film. In this method, since the GaAs semiconductor layer is highly sensitive to chemical treatment, when the wet etching method is used, side etching occurs. For this reason, this method is inappropriate for forming a micropattern such as a gate electrode. Note that in a GaAs FET, a submicron micropattern must be formed.

Therefore, a lift-off method has been developed for micropatterning. This method is described in U.S. Pat. No. No. 3,994,758. However, the metal film formed by this method is formed by CVD at a low temperature because of a resist film. For this reason, bonding between a metal multilayer and a semiconductor substrate constituting an electrode pattern is inadequate. Therefore, the electrode pattern is easily removed during lifting off or wire bonding, thus degrading the yield in manufacturing of the GaAs FET.

SUMMARY OF THE INVENTION

It is an object of the present invention to provide a method of forming an electrode pattern having a high bonding strength to a GaAs semiconductor substrate.

It is another object of the present invention to provide a method of forming an electrode pattern appropriate for forming a submicron micropattern.

It is still another object of the present invention to provide a semiconductor device in which an electrode pattern having a high bonding strength to a GaAs semiconductor substrate is formed.

According to the present invention, there is provided a method of forming an electrode pattern on a surface of a semiconductor substrate, comprising the steps of:

(a) forming at least one first metal film which can be easily etched by a reactive ion etching technique on a surface of the semiconductor substrate;

(b) forming on the first metal film at least one second metal film which is hardly etched by the reactive ion etching technique but can be easily etched by an ion milling technique;

(c) forming a desired resist pattern on the second metal film;

(d) selectively etching the second metal film by the ion milling technique using the resist pattern as a mask; and (e) selectively etching the first metal film by the reactive ion etching technique using the remaining second metal film as a mask.

Furthermore, according to the present invention, there is provided a semiconductor device comprising an electrode pattern on a surface of a semiconductor substrate, wherein the electrode pattern has a multilayer structure selected from the group consisting of Au/WN, Au/W/TiW and Au/Mo/TiW (elements on the left side are positioned uppermost with respect to the semiconductor substrate).

In an ion milling technique used in the present invention, etching is performed by bombarding a member to be etched with ions of an inert gas such as Ar or At+$O_2$ gas using a shower or beam type device. This technique is inert dry etching and is also called ion etching. This ion milling technique has been disclosed in, e.g., Solid State Tech. March 1983, Japanese Edition p. 51 to 62. In a reactive ion etching technique, by using a parallel-plate, microwave or ion-shower type device, dry etching is performed by reactive plasma using a reactive gas mixture such as $CF_4+O_2$ or $CF_4+Cl$ while activating a member to be etched using an inert gas such as Ar gas.

In the present invention, a metal (to be referred to as a second metal hereinafter), e.g., Au, Pt, Al, having an extremely low etching rate in reactive ion etching but a relatively high etching rate in ion milling is used for forming an upper layer of an electrode pattern of a multilayer structure. A metal (to be referred to as a first metal hereinafter), e.g., Ti, W, Mo, TiW, WN, MoSi, having a high etching rate in reactive ion etching and a high bonding strength to GaAs is used for forming a lower layer of the electrode pattern of the multilayer structure. First, the second metal film is anisotropically etched by ion milling. Thereafter, using a pattern of the second metal film obtained as a mask, the second metal film is anisotropically etched by reactive ion etching (RIE) under conditions which cause less damage to a GaAs substrate.

Note that the resist pattern is formed in a manner where a resist is coated on a metal multilayer and is exposed. However, since an Au or Al layer is generally used an an uppermost layer of the metal multilayer, a precise resist pattern cannot be obtained due to a reflection of an exposing beam. For this reason, a Ti film having a high etching selectivity with respect to that of the Au or Al film (e.g., the Ti film has an etching rate of 45 Å/min in comparison to that of the Au film of 1,600 Å/min) is formed on the Au or Al layer and the resist pattern is formed thereon. In this manner, a more precise resist pattern can be obtained. The Ti film can be removed by etching as needed.

According to the method of the present invention, a novel electrode pattern structure such as WN/Au or TiW/W/Au can be easily formed which has a higher bonding strength with respect to a GaAs semiconductor substrate than a conventional Ti/Al or Ti/Au electrode pattern structure.

DETAILED DESCRIPTION OF THE PREFERRED EMBODIMENTS

The present invention will be described hereinafter by way of examples shown in FIGS. 1 to 3.

EXAMPLE 1

Figure 1:
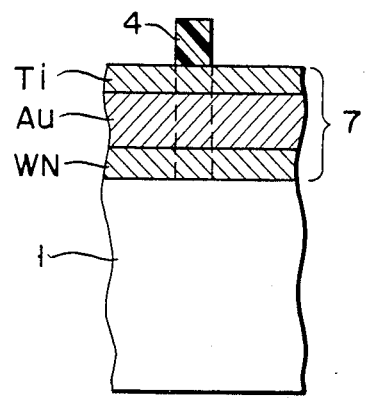
FIGS. 1 to 3 are sectional views of a main part of a semiconductor device for explaining a method of the present invention.

As shown in FIG. 1, a WN layer as a first layer of of a thickness of 500 to 1,000 Å, an Au layer as a second layer of a thickness of 5,000 Å and a Ti layer (precision exposure film) as a third layer of a thickness of 1,000 Å were sequentially formed on a GaAs semiconductor substrate 1 by continuous sputtering so as to form a metal multilayer 7. Thereafter, a resist pattern 4 was formed on the multilayer 7. The Ti and Au layers were etched by ion milling using the resist pattern 4 as a mask (under etching conditions: pressure: $2\times 10^{-4}$ Torr, cathode current: 0.55 mA/cm$^2$, neutralizer current: 0.99 mA/cm$^2$, electric voltage: 400 V, gas: Ar or Ar+O$_2$ (for Au layer).), and the Ti layer was removed thereafter. The WN layer was selectively etched by RIE using the remaining Au layer as a mask (under etching conditions: Gas: CF$_4$+O$_2$, pressure 5 pa.s, flow rate of gas: 25.5 cc/min., RF output: 100 W, time: about 6 minutes.), thereby forming an electrode pattern of a mininum width of 0.8 μm having a WN/Au hierarchical structure indicated by dotted lines in FIG. 1.

When a plurality of GaAs FETs having the above electrode patterns were manufactured and peeling of the electrode pattern was examined, better results were obtained in comparison to conventional GaAs FETs formed by a lift-off method. That is, when the GaAs FETs were annealed at a temperature of 820° C. for 5 seconds, in all the conventional FETs, a Schottky barrier was broken, but in the FETs of the present invention, the Schottky barrier was not damaged.

EXAMPLE 2

Figure 2:
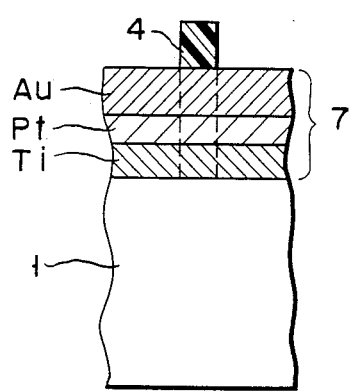

In an example shown in FIG. 2, a Ti layer as a first layer of a thickness of 500 to 1,000 Å, a Pt layer as a second layer of a thickness of 500 to 3,000 Å and an Au layer as a third layer of a thickness of 4,000 Å were sequentially deposited on a GaAs semiconductor substrate 1 by continuous sputtering so as to form a metal multilayer 7. Thereafter, the Au and Pt layers were selectively etched by ion milling using a resist pattern 4 formed on the multilayer 7 as a mask under the same conditions as those in Example 1. Furthermore, the Ti layer was selectively removed by RIE under the same conditions as those in Example 1, thereby forming a bonding pad having a three-layered structure as indicated by dotted lines in FIG. 2.

EXAMPLE 3

Figure 3:
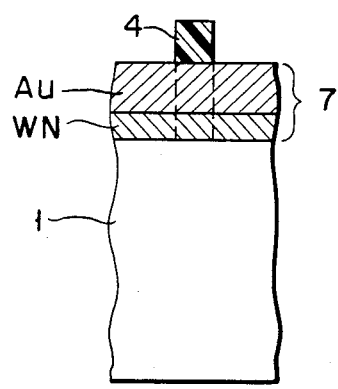

In an example shown in FIG. 3, a WN layer as a first layer of a thickness of 500 to 1,000 Å and an Au layer as a second layer of a thickness of 6,000 Å were sequentially formed on a GaAs semiconductor substrate 1 by sputtering, thus forming a metal multilayer 7. The Au layer was selectively etched by ion milling using a resist pattern 4 formed on the multilayer 7 as a mask under the same conditions as those in Example 1. Thereafter, the WN layer was selectively etched by RIE using the remaining Au layer as a mask under the same conditions as those in Example 1, thereby forming a bonding pad having a two-layered structure indicated by dotted lines in FIG. 3.

When peeling of the metal multilayers in the bonding pads of the GaAs FETs of Examples 2 and 3 was compared with that of the bonding pad of the conventional GaAs FET in the same manner as in Example 1, it was found that the bonding pad according to the present invention was very stable in comparison to the conventional one.

Various other GaAs FETs having, e.g., a bonding pad having a two-layered structure with a Ti layer as a first layer and an Al layer as a second layer, a bonding pad having a four-layered structure of Ti/Au/Pt/Ti (uppermost Ti layer serves as a precision exposure film), a bonding pad having a three-layered structure of Ti-/Al/Ti (uppermost Ti layer serves as a precision exposure film), are formed in the same manner as described above. The GaAs FETs having a strong bonding pad could be obtained without metal peeling.

In the bonding pads having the various structures described above, a submicron minimum width of 0.3 μm can be achieved.

According to the present invention, metal films for an electrode pattern are formed on a GaAs substrate so as to form a multilayer structure, and the resultant structure is etched in the two steps of ion milling and RIE. Thus, the electrode pattern which is micropatterned and highly resistant to peeling can be formed, resulting in an improvement in manufacturing yield and reliability of GaAs FETs.

What is claimed is:

1. A method of forming an electrode pattern on a surface of a semiconductor substrate, comprising the steps of:
   (a) forming at least one first metal film which can be easily etched by a reactive ion etching technique on a surface of the semiconductor substrate;
   (b) forming on the first metal film at least one second metal film which is hardly etched by the reactive ion etching technique but can be easily etched by an ion milling technique;
   (c) forming a desired resist pattern on the second metal film;
   (d) selectively etching the second metal film by the ion milling technique using the resist pattern as a mask; and
   (e) selectively etching the first metal film by the reactive ion etching technique using the remaining second metal film as a mask.

2. A method according to claim 1, wherein when not less than two second metal films are formed in step (b), one second metal film which has a considerably lower etching rate by the ion milling technique in comparison to that of other second metal films is formed as an uppermost layer.

3. A method according to claim 2, wherein the uppermost layer is a titanium film.

4. A method according to claim 1, wherein the first metal film is one member selected from the group consisting of a titanium film, a molybdenum film, a titanium tungsten film, a tungsten nitride film, and a molybdenum silicon film.

5. A method according to claim 1, wherein the first metal film is a Schottky barrier metal.

6. A method according to claim 1, wherein the second metal film is a gold film.

7. A method according to claim 1, wherein the second metal film is at least one member selected from the group consisting of a gold film, a platinum film and an aluminum film.

8. A method according to claim 1, wherein the first metal film is a tungsten nitride film, and the second metal film is a gold layer.

9. A method according to claim 1, wherein the first metal film is a combination of tungsten/titanium tungsten, and the second metal film is a gold film.

10. A method according to claim 1, wherein the first metal film is a combination of molybdenum/titanium tungsten, and the second metal film is a gold film.

11. A method according to claim 1, wherein the first metal film is a titanium film, and the second metal film is a combination of gold/platinum.

12. A method according to claim 1, wherein the ion milling technique is performed using argon gas or an argon-oxygen mixture.

13. A method according to claim 1, wherein the first and second metal films are formed by sputtering.

* * * * *